United States Patent [19]

Aldridge et al.

[11] 4,188,085

[45] Feb. 12, 1980

[54] HIGH DENSITY SOLDER TAIL CONNECTOR ASSEMBLY FOR LEADLESS INTEGRATED CIRCUIT PACKAGES

[75] Inventors: Lionel D. Aldridge, Seminole, Fla.; George J. Sprenkle, Phoenixville, Pa.

[73] Assignee: Burroughs Corporation, Detroit, Mich.

[21] Appl. No.: 946,279

[22] Filed: Sep. 27, 1978

[51] Int. Cl.² .............................................. H05K 1/10
[52] U.S. Cl. ....................... 339/176 MP; 339/17 CF; 339/221 R
[58] Field of Search ....... 339/17 CF, 17 CM, 75 MP, 339/174, 176 MP; 361/413, 415; 174/52 FP

[56] References Cited

U.S. PATENT DOCUMENTS

| | | | |
|---|---|---|---|
| 3,771,109 | 11/1973 | Bruckner et al. | 339/174 |
| 3,871,736 | 3/1975 | Carter | 339/221 R |
| 3,873,173 | 3/1975 | Anhalt | 339/17 CF |
| 3,940,786 | 2/1976 | Scheingold et al. | 339/17 CF X |
| 3,951,491 | 4/1976 | Mysiak | 339/17 CF |
| 3,951,495 | 4/1976 | Donaher et al. | 339/17 CF |
| 3,953,101 | 4/1976 | Palecek | 339/17 CF X |
| 3,955,067 | 5/1976 | Braun et al. | 339/17 CF |
| 3,982,159 | 9/1976 | Dennis et al. | 339/17 CF X |
| 3,993,384 | 11/1976 | Dennis et al. | 339/17 CF |
| 3,999,827 | 12/1976 | Hutchison et al. | 339/17 CG |
| 4,008,938 | 2/1977 | Anhalt et al. | 339/17 CF |
| 4,035,046 | 7/1977 | Kloth | 339/17 CF |
| 4,050,755 | 9/1977 | Hasircoglu | 339/17 CF |
| 4,052,118 | 10/1977 | Scheingold et al. | 339/17 CF |

FOREIGN PATENT DOCUMENTS

2132915  12/1976  France .............................. 339/17 CF

Primary Examiner—E. F. Desmond
Attorney, Agent, or Firm—Kevin R. Peterson; Edward J. Feeney, Jr.; Dale V. Gaudier

[57] ABSTRACT

A high density solder tail connector assembly for leadless integrated circuit packages. The plastic connector package includes upper and lower header portions each having a plurality of mating terminal reception channels formed therein. The upper header portion includes probing holes to allow ready testing of integrated circuit packages mounted on the connector assembly. Each channel is designed to receive an inner and an outer type of S-shaped spring-beam contact. Each type of unitary contact includes a contacting portion, a generally S-shaped spring-beam portion, a probe portion, a base portion, and a solder tail or wire-wrap portion. The two types of contacts differ with respect to the location of the solder-tail portion. Each contact is provided with an offset or dog-leg portion adjacent to the solder tail portion which allows the two types of solder tail portions to project in a staggered fashion from the underside of the lower header, thus easing spacing requirements for printed circuit board holes into which the solder tail would be placed. Preloading means formed in the upper header portions insure that all contacts are automatically preloaded when the upper and lower header portions are secured together.

17 Claims, 14 Drawing Figures

HIGH DENSITY SOLDER TAIL CONNECTOR ASSEMBLY FOR LEADLESS INTEGRATED CIRCUIT PACKAGES

CROSS REFERENCE TO RELATED APPLICATIONS

This invention is related to the following patent application filed simultaneously herewith and assigned to the assignee of this application:

Ser. No. 946,280, by Aldridge, entitled High Density Double Contacting Connector Assembly For Leadless Integrated Circuit Packages, filed Sept. 27, 1978.

BACKGROUND OF THE INVENTION

1. Field of the Invention

The invention relates to connector devices for integrated circuit packages and more particularly to a high density solder tail connector assembly for leadless integrated circuit packages having automatically preloaded contacts and a probing or testing facility.

2. Description of The Prior Art

Connector packages for leadless integrated circuit packages are well-known in the art. These packages generally include a one or two piece header unit having two parallel rows of linearly disposed contact terminal cavities formed therein for reception of spring-type metal contacts. Due to the increasing density of large scale integrated circuit devices (LSIs) it is common to encounter such devices having 50 or greater terminal pads disposed thereon. Connection to these pads requires a high degree of accuracy in fabrication and alignment of the various components of a leadless LSI package connector. Where solder tail or wirewrap terminals are provided for direct wiring to via holes of a printed circuit board, the high density of many prior art linear "pin-out" schemes has caused considerable problems since via holes in associated conductor paths on the printed circuit board must be spaced on 0.050 inch centers. It has been proposed to lessen the "pin-out" density by staggering each row of solder tail terminals as is shown in U.S. Pat. No. 3,999,827. However, such schemes have fallen short in that they have required a considerable amount of the header material to be used to provide dielectric and mechanical isolation within each pair of terminals. Such prior art schemes have failed to provide for adequate and automatic preloading of the terminal itself when the connector package is assembled. Preloading a terminal allows a force to be present upon the instant of contact of an LSI terminal pad with the contacting portion of a connector terminal, thus insuring good electrical conductivity since proper terminal contact-to-IC package pad pressure is available the instant the LSI package is mounted onto the connector package. Furthermore, preloading allows a certain amount of beneficial self-wiping action by the contacting portion of the connector terminals.

Prior art spring-type contact terminals have been formed in roughly "C" and "S" shaped configurations of strip-like spring metals of various types. Generally, such contacts have been formed from long pieces of narrow conductive metal strips or wire, such as shown in U.S. Pat. Nos. 3,999,827, 3,955,867, 4,052,118, 4,050,755, 3,953,101, 3,993,384, 3,951,495 and 3,771,109. However, such terminals are difficult and expensive to fabricate since the compound curves needed to insure uniform spring pressure from terminal to terminal are difficult to form reproducably and require special metal forming equipment. Additionally, after numerous insertion-removal cycles of an LSI package in a particular connector assembly, these bent strips will tend to weaken along their bends, thus lowering the spring pressure and contact pressure below desirable limits. Additionally, where the solder tail portion is also formed of strip-like metallic material, such solder tails have tended to be easily damaged or bent during fabrication, requiring much manual labor to straighten them before the connector can be mounted on a printed circuit board.

It will be noted that these prior art terminals are usually arranged such that the width of the terminal is aligned horizontally, thus imposing the requirement that each terminal receiving cavity be at least as wide as the width of the terminal. Such prior art arrangements limit the number of terminals which can be placed within a given size of connector package. It has been proposed to lessen the spacing requirements of the terminals by forming them of stamped sheet metal and mounting them vertically edgewise, as shown in U.S. Pat. No. 3,871,736.

Finally, though it has been proposed to include probe holes associated with each terminal to allow testing of a completed connector-LSI package assembly, such as shown in U.S. Pat. No. 3,955,867, such structures have suffered from the disadvantage that contact must be made against a bent strip conductive metallic material which is prone to metal fatigue after numerous probing operations. Such prior art probing terminals will tend to permanently "give" or flatten out of reach of the probe tip after awhile, resulting in loss of the probing facility at that particular terminal.

SUMMARY OF THE INVENTION

These and other disadvantages of prior art devices are overcome in the present invention wherein there is provided a connector assembly for leadless integrated circuit packages comprising upper and lower molded plastic header portions, each header having a plurality of mating terminal reception channels or cavities formed therein. Each channel accommodates a complementary pair of S-shaped spring-beam contacts. Each type of contact is formed in a unitary piece by die-stamping from conductive sheet material, each type of contact including an arcuate contacting portion, and an elongated S-shaped spring-beam portion, a probe portion, a base portion, and a solder tail or wire-wrap portion.

The invention is further characterized in that the S-shaped spring-beam contacts may be formed having a variable cross-sectional area. Each contact is provided with an offset or dog-leg portion adjacent the solder tail portion which allows the solder tails of the two types of contacts to project in a staggered fashion through mating solder tail openings provided in the underside of the lower header. A plurality of slot-like openings are provided in the upper header for reception of the arcuate contacting portions of each contact which project therethrough to make contact with a leadless IC package. Preloading means are provided in the mating channel portions of the upper header terminal channels adjacent to each slot-like contact opening to cooperate with preloading tabs or projections formed adjacent to the arcuate contacting portion of each contact. The upper header further includes probing holes formed adjacent to the probe portions of the contacts to allow ready access thereto.

The lower header portion includes a V-shaped groove formed on the upper portion of the walls separating each lower contact reception cavity and parallel thereto, and the upper header portion includes mating V-shaped projections formed in the upper interior portion of each upper contact reception cavity. The mating V-shaped projections and grooves of the contact cavities interlock with each other during assembly to precisely locate and isolate each pair of inner and outer contacts, insure good electrical and mechanical isolation, and to control the wiping-action of the contacting portion of each contact.

The upper and lower header portions are held together by a single flat head screw and captive nut. The upper portion of the header is provided with package locating pins to allow ready alignment of the upper and lower header portions during assembly. The upper surface of the upper header portion further includes IC package mounting pins or studs formed thereon.

With the above-described construction the two piece header assembly can be readily separated in field use to allow ready replacement of damaged contacts. The use of stamped-unitary sheet metal spring-beam contacts of elongated S-shape and having a controllably variable cross sectional area allows the spring constant and resultant contact forces to be precisely tailored for a particular application. Further, the use of a die-stamped unitary sheet metal contact allows the arcuate contacting portion, the S-shaped spring portion, the probe portion, the base portion, and the solder tail portion to be formed in a one-step operation. The complementary pairs of inner and outer contacts having staggered tail portions are precisely located in each contact cavity by means of the intermeshing V-shaped grooves and projections formed therein on the lower and upper header portions, thus allowing higher contact densities to be achievable with good electrical and mechanical isolation because the contacts can be mounted with their edges vertically aligned, while maintaining a low density pin-out configuration for the solder tail portions. Further, the provision of preload tabs formed on the contacts cooperating with preloading means formed on the upper interior portion of each upper header contact cavity allows all the contacts to be automatically preloaded when the upper and lower portions of the header are assembled.

BRIEF DESCRIPTION OF THE DRAWINGS

These and other objects, features, and advantages of the present invention will be readily apparent from the following description of the preferred embodiment taken in conjunction with the appended claims and the accompanying drawing figures wherein:

DESCRIPTION OF THE PREFERRED EMBODIMENT

Figure 1:
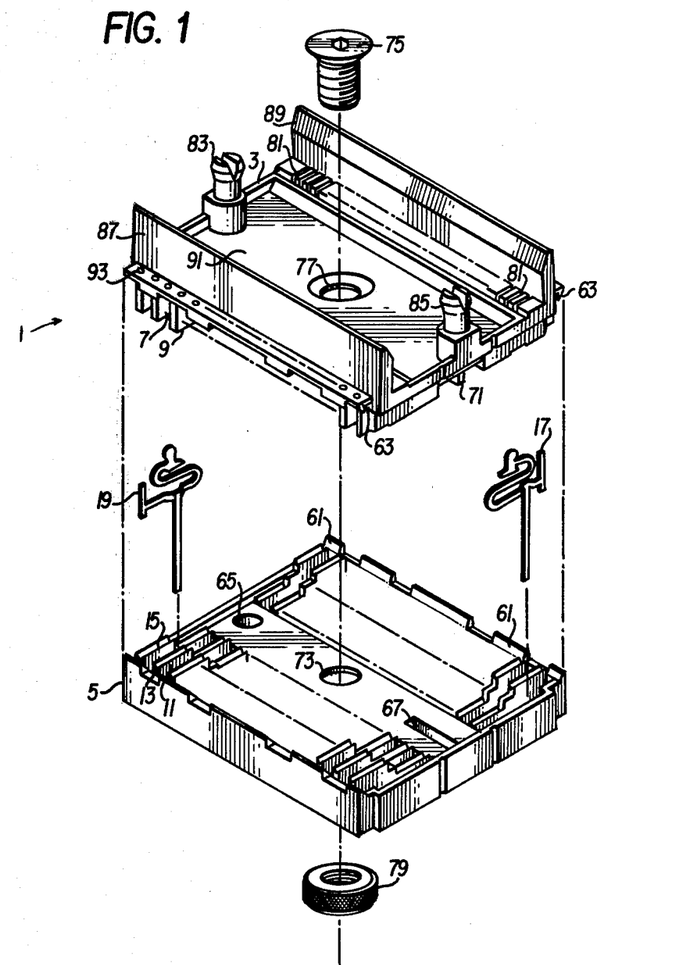
FIG. 1 is an exploded perspective view of the various components comprising the connector assembly of the present invention.

Referring to FIG. 1, there is shown an exploded perspective view of the connector assembly 1 of the present invention comprised of a two piece generally rectangular header, upper header 3 and lower header 5. The upper header has two rows of a plurality of upper contact receiving cavities 7, each cavity 7 being separated from its neighbor by a wall 9. Similarly, the lower header portion 5 has two rows of a plurality of lower contact receiving cavities 7, each cavity 11 being separated from its neighbor by a wall 13. It will be noted that the upward portion of each lower cavity wall 13 has a V-shaped groove 15 formed thereon. This V-shaped groove is designed to matingly fit against a V-shaped projection 107 formed in the upper interior portion of the upper header contact receiving cavities 7 (shown more clearly in FIG. 14). It will also be noted that when upper header 3 is fitted over lower header 5 the upper header cavity walls 9 will project down and intermesh with the lower header cavities 11 and the lower header cavity walls 13 will project upwardly and intermesh with the upper header cavity 7 to define two contact receiving areas.

Figure 7:
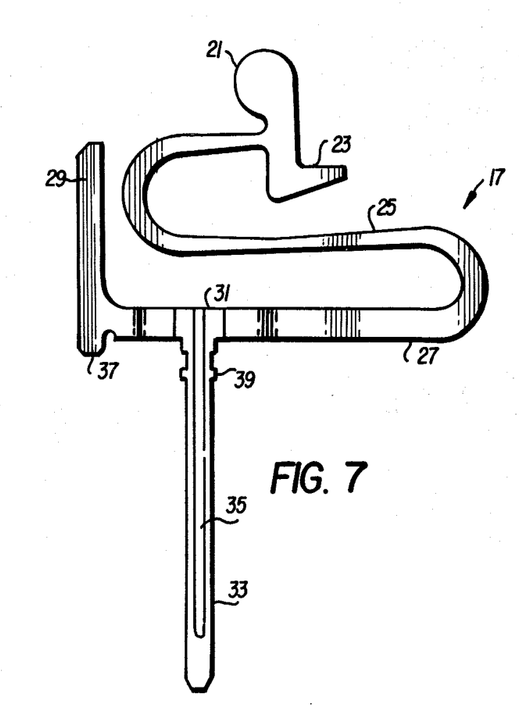
FIG. 7 is a front view of an outer-type contact as shown in FIG. 1.
Figure 8:
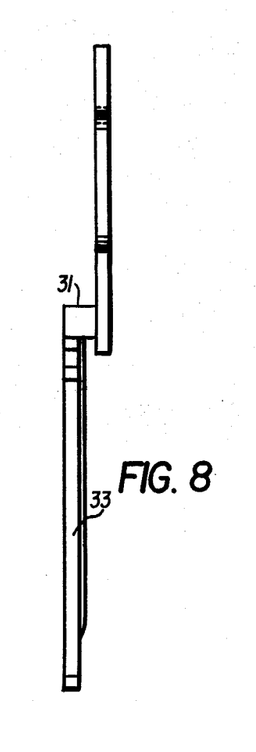
FIG. 8 is a left-side view of the outer-type contact shown in FIG. 7.

Each pair of contact receiving areas is designed to accommodate a complementary pair of spring metal contacts, shown generally as outer contact 17 and inner contact 19 in FIG. 1. Contacts 17 and 19, shown in more detail in FIGS. 7, 8, 9, and 10, are formed from diestamped conductive sheet material such as CA 638, manufactured by Olin Brass Company, of approximately 0.012 inch thickness. As shown in FIG. 7, outer contact 17 comprises an arcuate IC terminal pad contacting portion 21, a preloading tab 23, an elongated S-shaped springbeam portion 25, a base portion 27, a probe terminal portion 29, a dog-leg portion 31 and a solder tail or wire-wrap portion 33. Solder tail portion 33 may further include a stiffening rib or groove 35 formed along its length during the die stamping operation. Also shown is location feature 37, formed on the lower part of probe terminal 29, and solder inclusion standoff 39 formed on solder tail 33 adjacent dog-leg portion 31.

Figure 9:
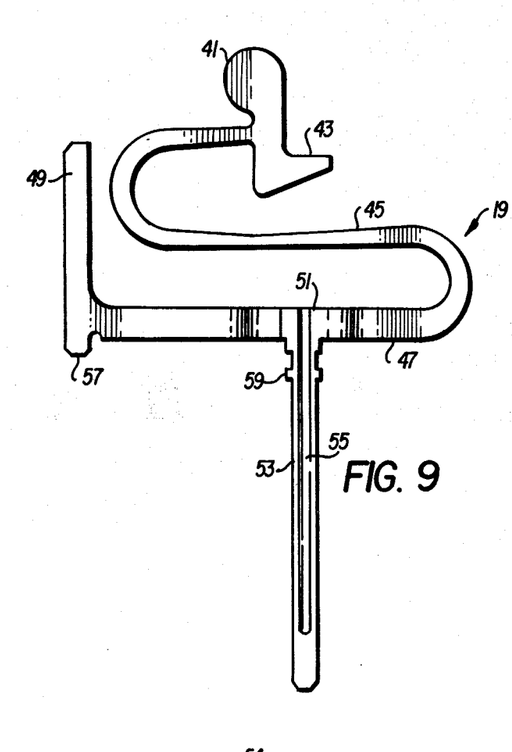
FIG. 9 is a front view of an inner-type contact as shown in FIG. 1.

Similarly, as shown in FIG. 9, inner contact 19 comprises an arcuate contacting portion 41, a preloading tab 43, an elongated S-shaped spring-beam portion 45, a base portion 47, a probe terminal portion 49, a dog-leg or offset portion 51, and a solder tail or wire-wrap portion 53. Solder tail portion 53 may further include a stiffening rib or groove 55 formed along its length. Also shown is location feature 57, formed on the lower part of probe terminal 49, and solder inclusion standoff 59 formed on solder tail 53 adjacent dog-leg portion 51. Contacts 17 and 19 differ solely with respect to location of the juncture of solder tails 33 and 53 with their respective base portions 27 and 47. It will be noted that dog-leg portions 31 and 51 are formed in a complementary fashion so as to enable each pair of contacts 17 and 19 to be spaced a very short distance apart when placed within the lower cavities 11 of lower header portion 5.

Contacts 17 and 19 preferably are formed having a variable cross sectional area along their respective spring-beam portions 25 and 45. It has been discovered that by altering the cross sectional area of the spring-beam, a contact may be formed having a nearly uniform spring pressure and vertically linear travel regardless of the moment force being applied to the contacting portion 21 or 41. Ideally, the tapered cross section may be tailored to the particular needs of the IC package to be contacted, as would be apparent to those skilled in the art. Since the taper is formed as part of the die-stamping process, the spring constant of a particular contact is readily and controllably "built-in" without the need for complex wire or spring bending operations as used in the prior art.

Figure 10:
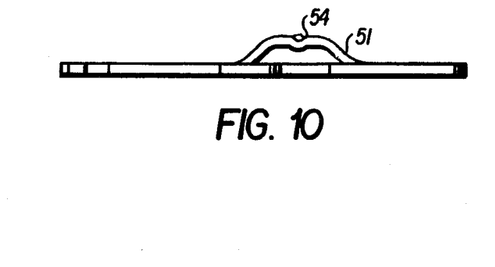
FIG. 10 is a top view of an inner-type contact shown in FIG. 9.

After fabrication, contacts 17 and 19 are preferably overcoated with 50 microinches of ductile nickel followed by 100 microinches of gold to the contacting areas 21 and 41, 30 microinches of gold to the probe tip portions 29 and 49, and 10 microinches of gold over the rest of the contact. Such overcoating helps to improve the electrical characteristics of the contact and helps prevent oxide corrosion, as is well-known in the art. Tails 33 and 53 may further include a solder inclusion 54 as shown in FIG. 10.

Figure 2:
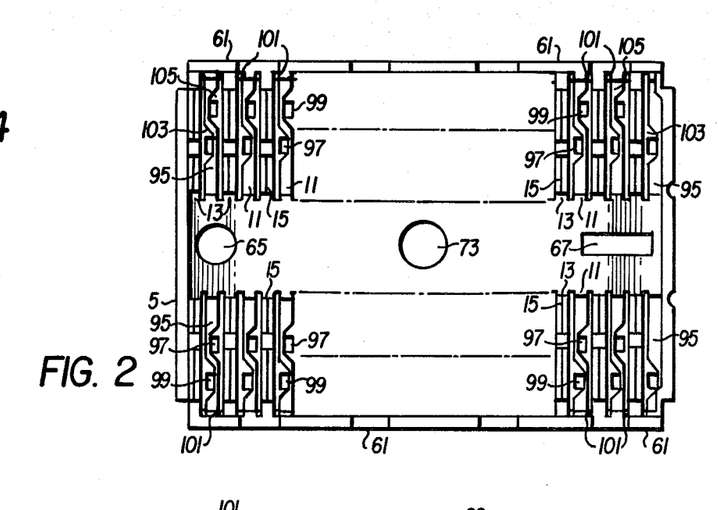
FIG. 2 is a top view showing the interior structure of the contact cavities of the lower header portion shown in FIG. 1.

Referring again to FIG. 1, it can been that lower header 5 further includes a series of V-shaped projections 61 formed along the outer edges of the upper portion of lower header 5 (also shown in FIG. 2). These projections fit into mating recessed portions 63 formed along the outer edges of the lower portion of upper header 3 (also shown in FIG. 6). Projections 61 and recesses 63 interfit when header portions 3 and 5 are pressed together to help hold the two portions together.

Also shown in FIG. 1 are locating and alignment features 65 and 67. Hole 65, disposed at one end of the lower header 5, and slot 67, disposed at the opposite end, are designed to receive a mating peg 69 and a rectangular projection 71, respectively, formed on the underside of upper header 3, as shown clearly in FIG. 6. By this means an operator is prevented from misassembling the header portions 3 and 5. Lower header 5 further includes a central opening 73 for reception of a threaded bolt 75. Threaded bolt 75 is designed to fit through opening 77 provided in upper header 3 and opening 73 in lower header 5. When upper and lower header portions 3 and 5 are assembled together nut 79 will be screwed onto bolt 75 passing through openings 77 and 73 to securely hold the assembled upper and lower header portions 3 and 5 together.

Figure 4:
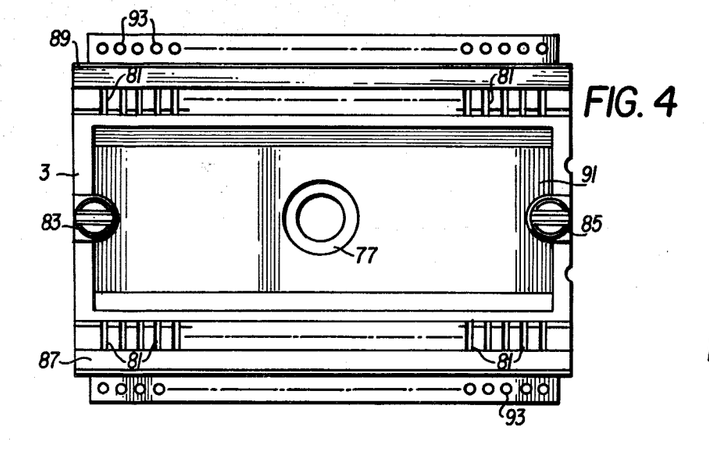
FIG. 4 is a top view of the upper header portion shown in FIG. 1 showing the probe holes and contact openings structure.

As shown in FIGS. 1 and 4, upper header 3 includes two parallel rows of slot-like openings 81, each slot-like opening communicating with an upper terminal receiving cavity 7. Openings 81 are designed to accommodate the arcuate contacting portions 21 and 41 of outer and inner contacts 17 and 19, respectively, as shown more clearly in FIG. 11. Preferably, openings 81 are made slightly wider than the thickness of contacting portions 21 and 41 of contacts 17 and 19 to allow a small amount of side-to-side contact wipe. Also shown in FIG. 1 are split-end mounting studs 83 and 85 formed on the upper surface of upper header 3. Studs 83 and 85 are designed to matingly fit through mounting holes provided on a leadless IC package such as shown in U.S. Pat. No. 3,955,867. Vertical walls 87 and 89 further define the horizontal IC package receiving area 91. Walls 87 and 89 are parallely disposed adjacent to the two parallel rows of slotted openings 81 and probe holes 93 formed on upper header 3. Walls 87 and 89 act to insure electrical and mechanical isolation of a mounted IC package (not shown) from an electrical probe device such as shown in U.S. Pat. No. 3,955,867 during a probing operation. Probe holes 93 are normally equal in number to the number of slotted openings 81, each probe hole 93 being formed in close proximity to its corresponding slotted opening 81. Probe holes 93 are made of sufficient size to accept a vertical wirelike probe tip as disclosed in U.S. Pat. No. 3,955,867. When upper and lower header portions 3 and 5 are assembled together with their full complement of outer and inner contacts 17 and 19 placed within intermeshed receiving cavities 7 and 11, the respective probe portions 29 and 49 of outer and inner contacts 17 and 19 will project upwardly into the lower portions of their associated probe holes 93 as is shown more clearly in FIG. 11.

Figure 3:
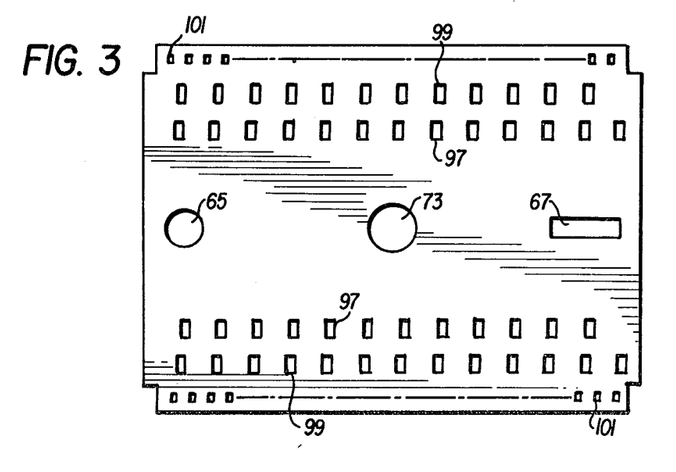
FIG. 3 is a bottom view of the lower header portion shown in FIG. 2 showing a preferred form of pinout configuration.
Figure 6:
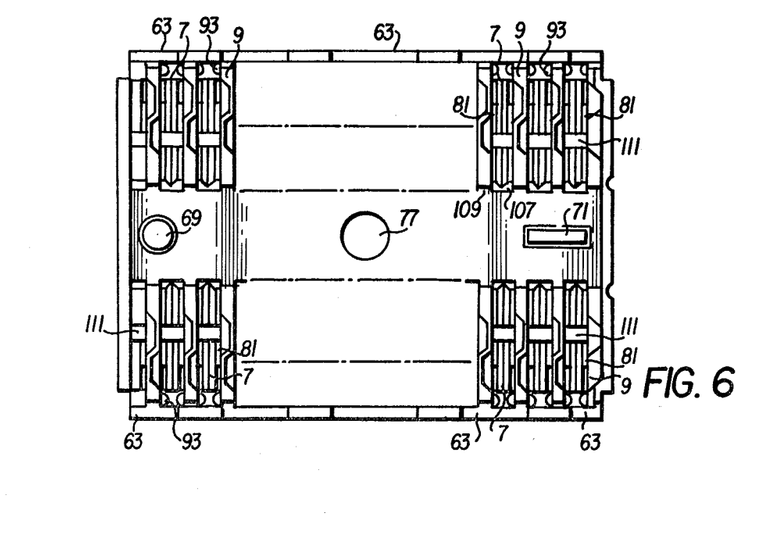
FIG. 6 is a bottom view showing the interior structure of the contact cavities of the upper header portion shown in FIG. 4.
Figure 13:
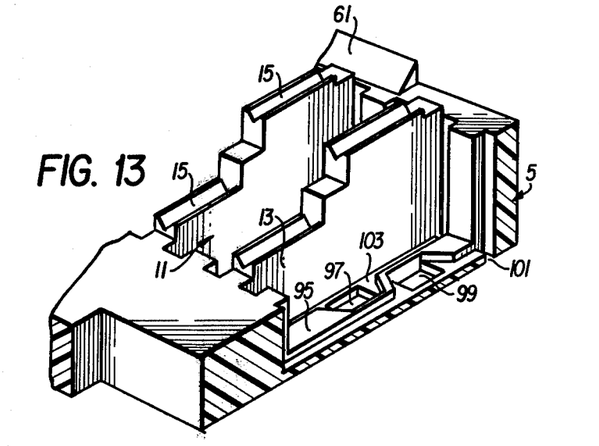
FIG. 13 is a partial broken-perspective view of the lower header shown in FIG. 1.
Figure 14:
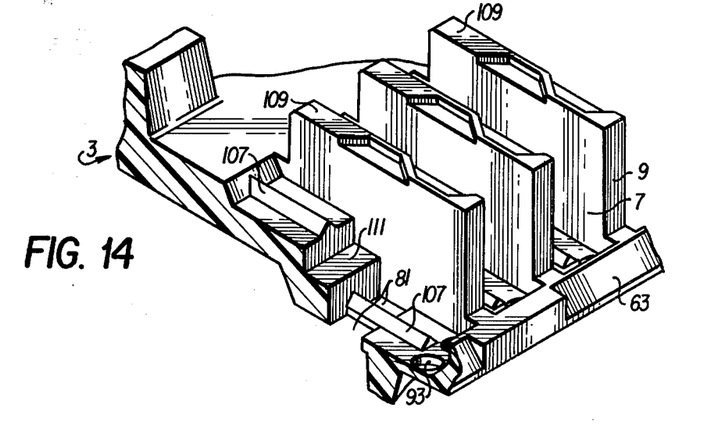
FIG. 14 is a partial broken-perspective view of the upper header shown in FIG. 1.

Turning now to FIG. 2 there is shown a top view of lower header 5. As can be seen, lower header 5 is generally of rectangular shape having two rows of parallely disposed contact receiving cavities 11 separated by a series of walls 13 each having a V-shaped groove 15 located along the upper portion thereof. As is shown clearly in FIG. 13, each contact receiving cavity 11 includes a raised area 95 of roughly S-shaped or dog-leg configuration to accommodate the respective complementary dog-leg portions 31 and 51 of outer and inner contacts 17 and 19 when received in the cavities 11. Each cavity 11 includes an inner and an outer solder tail opening 97 and 99, respectively. Openings 97 and 99 are staggered slightly to form the terminal pinout pattern or array of the present invention comprising two rows of slightly offset openings, as is shown more clearly in FIG. 3. Raised areas or ridges 95 are designed to matingly engage lower portions 109 of downwardly projecting walls 9 of upper header 3. When walls 9 intermesh with cavities 11, each cavity is divided in two parts or channels, the first part labeled as 103 accepting an inner type contact 19 and the second part labeled 105 accepting an outer type contact 17. Walls 13 of cavities 11 separate each such cavity from one another. Further, walls 13 include a two-level V-shaped groove 15 formed along their upper portions which would matingly engage V-shaped projections 107 formed within the upper interior portions of cavity 7 of upper header 3 as shown in FIGS. 6 and 14. Also shown in FIGS. 2 and 3 are the plurality of openings 101, each corresponding with an associated contact accepting area 105 or 103 for retaining their respective contact locating features 37 and 57 of outer and inner contacts 17 and 19.

Figure 5:
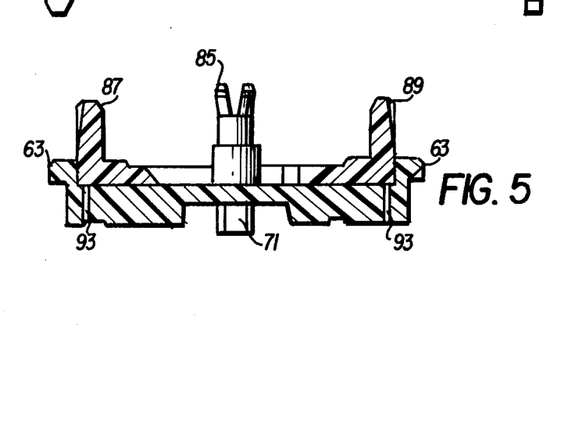
FIG. 5 is a right-side view of the upper header portion shown in FIG. 4.

Turning now to FIGS. 4, 5 and 6 there are shown respectively top, right side, and bottom views of the upper header 3 shown in FIG. 1. Upper header 3 is of generally rectangular shape having a pair of parallel facing vertical walls 87 and 89 formed on the upward surface thereof to define an IC package receiving area 91. Also formed on upper header 3 with an area 91 are two parallel rows of slotlike openings 81 to receive the arcuate contacting portions 21 and 41 of outer and inner contacts 17 and 19. A plurality of openings 93 for receiving the probe portions 29 and 49 of outer and inner terminals 17 and 19 are formed in two parallel rows distal to vertical walls 87 and 89, each opening 93 being generally disposed parallel with its associated slotlike opening 81. Also shown in FIG. 4 are split-end type mounting studs 83 and 85 formed on the upper surface 91 of header 3. Studs 83 and 85 are of generally cylindrical form each having a V-shaped split end formed on the upper ends thereof. Studs 83 and 85 are designed to fit through mounting holes formed on a leadless IC package so as to securely hold the IC package. Upper header 3 also has a central opening 77 adapted to receive a bolt 75 as described with respect to FIG. 1.

Turning now to bottom view of upper header 3 as shown in FIG. 6 and the more detailed view provided in FIG. 14, it can be seen that header 3 has a number of parallely disposed contact receiving channels or cavities 7 disposed therein, each cavity separated from its neighbor by a wall 9. Each wall 9 has a generally S-shaped raised area 109 formed on the lower portion thereof, which matingly fits the corresponding S-shaped raised area 95 formed on the lower portions of the contact receiving cavities 11 of lower header portion 5 as shown in FIGS. 2 and 13.

Each cavity 7 of upper header 3 further includes V-shaped projections 107 aligned parallel to walls 9. The V-shaped projections 107 are disposed at two levels, as shown in FIG. 14, with a preloading ledge 111 separating the two levels. The V-shaped projections 107 are designed to mate with corresponding V-shaped grooves 15 formed on the upper surface of contact cavity walls 13 of lower header 5. Also shown in FIGS. 6 and 14 are the interior cavity opening portions of slotlike openings 81 and probe holes 93. Also shown in FIG. 6 are alignment stud 69 and raised area 71 designed to matingly fit within alignment hole 65 at slotted opening 67 at lower header 5.

Upper and lower header portions 3 and 5 may be formed of various types of materials. In the preferred embodiment, upper and lower header portions 3 and 5 are formed of a thermoplastic material such as Valox 420. Of course, other types of electrically insulated materials could be used.

Figure 11:
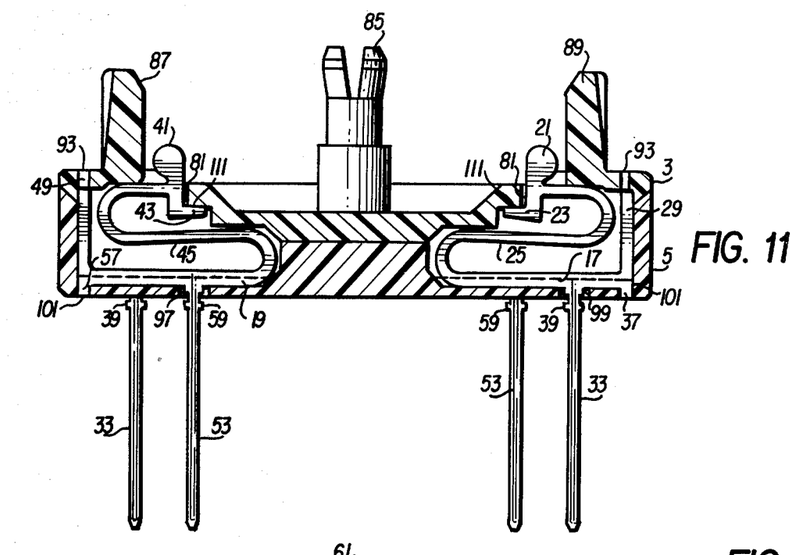
FIG. 11 is a right-side cross sectional view of the assembled connector of the present invention showing the relationship of the assembled components to each other.
Figure 12:
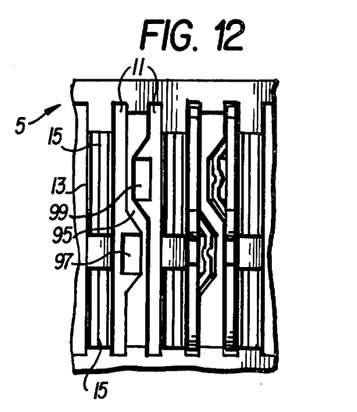
FIG. 12 is a magnified view of a portion of the interior structure of the contact cavities of the lower header shown in FIG. 2.

In assembly, outer and inner contacts 17 and 19 would be placed within their respective complementary contact receiving channels 105 and 103 formed within the lower portion of each contact receiving cavity 11 of the lower header 5. Contacts 17 and 19 are placed with their respective wire-wrap tails 33 and 53 projecting through the staggered pin-out openings 99 and 97 formed in the base of lower header 5. Raised area 95 acts to keep the inner and outer contacts aligned during assembly. The locating features 37 and 57 of contacts 17 and 19, respectively, fit securely into openings 101 formed in the base of lower header 5, as is shown in FIG. 11. When contacts 17 and 19 are mounted within lower header 5 with their wire-wrap tails 33 and 53 projecting through openings 99 and 97, their dogleg portions 31 and 51 abutting the S-shaped raised areas 95 formed within each cavity 11, and their locating features or tabs 37 and 57 securely fitted into openings 101, the contacts will be free-standing and precisely located with respect to the upper and lower headers 3 and 5, and to each other. Thus, when upper header 3 is assembled to lower header 5 the arcuate contacting areas 21 and 41 of contacts 17 and 19 will be precisely spaced and aligned so that they will pass easily through the slot-like openings 81 formed in upper header 3 without jamming. Additionally, the probe portions 29 and 49 of contacts 17 and 19 will be properly aligned in lower header 5 beneath their associated probe holes 93 formed in upper header 3.

When upper header 3 is assembled to lower header 5 it can be seen that the preloading ledges 111 cooperate with preloading tabs 23 and 43 of contacts 17 and 19 to cause a slight amount of vertical defection of the contact, as is shown in FIG. 11. The amount of preload can be precisely determined by either adjusting the height of the preload ledge 111 of upper header 3, or by adjusting the height of the contact preloading tabs 23 or 43 during the die-stamping operation. It is to be noted that preloading is automatic and simultaneous for all inner and outer contacts disposed within cavities 11 when the upper header 3 is mounted onto the lower header 5.

When upper and lower header portions 3 and 5 are assembled together walls 13 of lower header 5 and walls 9 of upper header 3 intermesh with each other so as to mechanically and electrically isolate each pair of inner and outer contacts. Grooves 15 formed on walls 13 of of lower header 5 mate with projections 107 formed within cavities 7 of upper header 3. Grooves 15 and projections 107 serve to both precisely locate the contact cavity areas 103 and 105 and to strengthen the dielectric walls therebetween. As can be seen, S-shaped surfaces 109 formed on walls 9 of upper header 3 mate with similarly shaped raised areas 95 formed in the lower portion of the contact receiving cavities 11 of lower header 5 to divide the cavities 11 into two complementary channels comprising inner type and outer type contact channels 103 and 105. Because of the S-shape of surface 109 and mating area 95 which conforms to the dogleg portions 31 and 51 of contacts 17 and 19 and the fact that contacts 17 and 19 are mounted with their edges vertically disposed, the contacts may be packed more densely than in prior art designs. However, because the invention provides for a staggered "pin-out" due to the use of inner and outer type contacts, printed circuit boards having broader via hole spacings may be used with the invention with a concomitant relaxation of board tolerances.

After the upper header portion 3 is properly mounted onto lower header portion 5 (as is ensured because of mating alignment features 65, 67 and 69, 71) a bolt or screw 75 is passed through openings 77 and 73 and secured by means of nut 79. Of course other types of fastening means could be used and would suggest themselves to those skilled in the art. The use of nut 79 and screw 75 allows the user to readily disassemble the connector, if desired.

After final assembly of the connector, a leadless IC package, such as shown in U.S. Pat. No. 3,955,867, may be mounted between walls 87 and 89 of upper header 3 so that its contact pads make an electrical connection with the exposed arcuate contacting areas 21 and 41 of contacts 17 and 19 projecting through slot-like openings 81. Such IC packages generally are formed with openings for receiving split-post mounting means such as shown at 83 and 85 in FIG. 1. The connector package may be soldered to a printed circuit board (not shown) having conductive leads and via holes formed thereon in a pattern corresponding to the "pin-out" configuration of the present invention. It will be noted that the wire-wrap tails 33 and 53 of contacts 17 and 19 each have a pair of projecting ears or standoffs 39 and 59, respectively, which act to raise the connector package slightly above the printed circuit board surface in order to aid in cleaning fluxes if the board and connector are wave soldered. Standoffs 39 and 59 may include solder inclusions as is well-known in the art which are used to ensure a good electrical connection to the printed circuit via holes during a soldering operation. Of course, wire-wrap tails 33 and 53 may be made as long or as short as desired for a particular application; indeed, tails 33 and 53 may be made only long enough to fit through via holes of a printed circuit board if no wire-wrap feature is desired.

Thus it can be seen that the present invention provides for a preloaded leadless integrated circuit connector package having increased contact density while providing for more relaxed "pin-out" tolerances. The connector assembly further includes a probing facility for each contact and means for ensuring electrical and mechanical isolation between contacts. The unique self-wiping contacts are formed in a single die-stamping operation, preferably with a variable cross section spring beam, resulting in more linear and precisely controllable forces in the contacts and more uniform forces after numerous insertion-removal cycles. The contacts have means for ensuring exact alignment during assembly, thus eliminating jamming or breakage of the contacts. The contacts are automatically preloaded during assembly of the two-part header.

While the connector assembly of the present invention has been described in considerable detail, it is understood that various changes and modifications may occur to persons of ordinary skill in the art without departing from the spirit and scope of the invention as is defined in the appended claims.

What is claimed is:

1. A connector assembly for leadless integrated circuit packages comprising:
    (a) a plurality of complementary pairs of unitary metallic contacts, each of said contacts comprising:
       (i) an elongated S-shaped spring-beam portion;
       (ii) a contacting portion formed on an upper part of said spring-beam portion;
       (iii) a preloading tab formed on said upper part of said spring-beam adjacent said contacting area;
       (iv) a substantially flat base portion connected to a lower part of said spring-beam portion;
       (v) a dog-leg portion formed on said base portion; and
       (iv) a downwardly extending tail portion formed on said dog-leg portion, said complementary pairs of contacts differing solely in the location of said dog-leg portion formed on said base portion; and
    (b) upper and lower dielectric headers each having a plurality of contact receiving cavities formed therein, said cavities separated by a plurality of intermeshing walls, each said cavity of said lower header including channel means for receiving said contact, and each said cavity of said upper header including contact receiving means and preloading means to bias said contact in a preloaded position when said upper header is fitted over said lower header.

2. The connector assembly of claim 1 wherein said upper header contact receiving means and preloading means includes an opening for receiving said contacting portion of said contacts and a preloading ledge formed adjacent to said contact receiving opening to cooperate with said preloading tab formed on said spring-beam portion of said contacts to controllably bias said spring-beam portion in a preloaded position when said upper header is fitted over said lower header.

3. The connector assembly of claim 1 wherein said spring beam portion of said contacts is formed having a variable cross section.

4. The connector assembly of claim 1 wherein said contacting portion of said spring-beam contacts is formed having an arcuate shape, said contacting portion for contacting terminal pads of a leadless integrated circuit device.

5. The connector assembly of claim 1 wherein said contacts include a probe portion formed on said base portion and projecting upwardly therefrom.

6. The connector assembly of claim 5 wherein said upper header contact receiving cavities each include an opening formed in an upper portion of said upper header cavity for receiving said probe portion of said contacts.

7. The connector assembly of claim 1 wherein said lower header channel means comprises a pair of substantially flat channel portions formed within said lower header contact receiving cavity, said channel portions having a dog-leg shaped ridge formed therebetween to separate said pairs of complementary contacts, each said channel portion including an opening for receiving said tail portion of said contacts.

8. A connector assembly for leadless integrated circuit packages comprising:
    (a) a plurality of complementary pairs of unitary metallic contacts, each of said contacts comprising:
       (i) an elongated S-shaped spring-beam portion;
       (ii) an arcuate contacting portion formed on a an upper part of said spring-beam;
       (iii) a preloading tab formed on said upper part of said spring-beam adjacent said arcuate contacting area;
       (iv) a substantially flat base portion connected to a lower part of said spring- beam portion;
       (v) a dog-leg portion formed on said base portion;
       (vi) a downwardly extending tail portion formed on said dog-leg portion;
       (vii) a probe portion formed on said base portion; and
       (viii) a locating pin formed on said base portion, said complementary pairs of contacts differing solely in the location of said dog-leg portion formed on said base portion; and
    (b) upper and lower dielectric headers each having a plurality of contact receiving cavities formed therein, said cavities separated by a plurality of intermeshing walls, each said cavity of said lower header including channel means for receiving said contacts and a locating opening formed within said channel means for receiving said contact locating pin to securably retain a contact inserted into said channel means, and each said cavity of said upper header including contact receiving means and preloading means to bias said contact in a preloaded portion when said upper header is fitted over said lower header.

9. The connector assembly of claim 8 wherein said upper header contact receiving means and preloading means includes a slot-like opening formed in said upper header cavity for receiving said arcuate contacting portion of said contacts, an opening formed in an upper portion of said upper header cavity for receiving said probe portion of said contacts, and a preloading ledge formed adjacent to said slot-like opening to cooperate with said preloading tab formed on said spring-beam portion of said contacts to controllably bias said spring-beam portion in a preloaded position when said upper header is fitted over said lower header.

10. The connector assembly of claim 8 wherein said lower header channel means comprises:
  a pair of substantially flat complementary channel portions formed within said lower header contact receiving cavity, each said channel receiving said base portion of one of said plurality of contacts;
  a dog-leg shaped dielectric ridge formed between each complementary pair of channel portions to separate said pairs of complementary contacts; and
  an opening for receiving said downwardly extending tail portion of said contact.

11. The connector assembly of claim 8 wherein said spring-beam portion of said contact is formed having a variable cross section.

12. The connector assembly of claim 10 wherein said pairs of complementary contacts are formed having their respective dog-leg portions offset from each other along each of their said bases such that said tail portions formed on said dog-leg portions project through said tail receiving openings formed in said pairs of channels formed in said lower header in a nonlinear manner with respect to each other.

13. A connector assembly for leadless integrated circuit packages comprising:
  (a) a plurality of complementary pairs of unitary metallic contacts, each of said contacts comprising:
    (i) an elongated S-shaped spring-beam portion;
    (ii) an arcuate contacting portion formed on an upper part of said spring-beam;
    (iii) a preloading tab formed on said upper part of said spring-beam adjacent said arcuate contacting area;
    (iv) a substantially flat base portion connected to a lower part of said spring-beam portion;
    (v) a dog-leg portion formed on said base portion;
    (vi) a downwardly extending tail portion formed on said dog-leg portion;
    (vii) a probe portion formed on said base portion;
    (viii) a locating pin formed on said base portion, said complementary pairs of contacts differing solely in the location of said dog-leg portion formed on said base portion; and
  (b) upper and lower dielectric headers each having a plurality of parallely disposed contact receiving cavities formed therein, said cavities separated by a plurality of intermeshing walls, each said cavity of said lower header including:
    a pair of substantially flat complementary channels formed within said lower header contact receiving cavity, each said channel receiving said base of one of said plurality of complementary contacts; an opening formed in a lower portion of each of said channels for receiving said contact locating pin; a dog-leg shaped dielectric ridge formed between each complementary pair of channels to separate and align said pair of complementary contacts; and an opening formed in each said channel for receiving said downwardly extending tail portion of said contacts; and
    each said cavity of said upper header including: a slot-like opening formed in an upper portion of said upper header cavity for receiving said arcuate contacting portion of said contacts; an opening formed in an upper portion of said upper header cavity for receiving said probe portion of said contacts, and a preloading tab formed on said spring-beam portion of said contacts to controllably bias said spring-beam portion in a preloaded position when said upper header is fitted over said lower header.

14. The connector assembly of claim 13 wherein said spring-beam portion of said contact is formed having a variable cross section.

15. The connector assembly of claim 13 including means for mounting a leadless IC package on said connector assembly.

16. The connector assembly of claim 13 wherein said pairs of complementary contacts are arranged within said complementary pairs of channels such that said tail members project downwardly through said tail receiving openings in a staggered array.

17. The connector assembly of claim 13 wherein said contacts are vertically, edgewise aligned within their respective contact receiving cavities.

* * * * *